US007145531B2

(12) United States Patent
Jo

(10) Patent No.: US 7,145,531 B2
(45) Date of Patent: Dec. 5, 2006

(54) ELECTRONIC CIRCUIT, ELECTRONIC DEVICE, ELECTRO-OPTICAL APPARATUS, AND ELECTRONIC UNIT

(75) Inventor: Hiroaki Jo, Fujimi-cho (JP)

(73) Assignee: Seiko Epson Corporation, Tokyo (JP)

( * ) Notice: Subject to any disclaimer, the term of this patent is extended or adjusted under 35 U.S.C. 154(b) by 495 days.

(21) Appl. No.: 10/781,830

(22) Filed: Feb. 20, 2004

(65) Prior Publication Data

US 2004/0208047 A1 Oct. 21, 2004

(30) Foreign Application Priority Data

Feb. 21, 2003 (JP) ............................ 2003-044351

(51) Int. Cl.
*G09G 3/30* (2006.01)
*G09G 3/32* (2006.01)
*G09G 5/00* (2006.01)
*G09G 3/10* (2006.01)
*H03M 1/60* (2006.01)

(52) U.S. Cl. .......................... 345/76; 345/82; 345/212; 315/169.1; 315/169.3; 341/144; 341/145

(58) Field of Classification Search .................. 345/76, 345/82, 98, 204, 212; 315/169.1, 169.3; 341/144, 145
See application file for complete search history.

(56) References Cited

U.S. PATENT DOCUMENTS 6,954,166 B1 * 10/2005 Kasai ......................... 341/144
6,961,054 B1 * 11/2005 Matsumoto ................. 345/204
6,963,336 B1 * 11/2005 Kimura ....................... 345/204
6,972,526 B1 * 12/2005 Abe ........................ 315/169.3
6,992,647 B1 * 1/2006 Hanada et al. ................ 345/76
7,046,240 B1 * 5/2006 Kimura ....................... 345/212

FOREIGN PATENT DOCUMENTS

JP A-2000-122608 4/2000
JP A-2001-42827 2/2001
JP A 2001-042827 2/2001
JP A-2003-233347 8/2003

* cited by examiner

*Primary Examiner*—Henry N. Tran
(74) *Attorney, Agent, or Firm*—Oliff & Berridge PLC

(57) ABSTRACT

The invention provides an electronic circuit, an electronic device, an electro-optical apparatus, and an electronic unit in which characteristic variations of transistors can be suppressed. More particularly, the invention provides an electronic circuit having a digital-to-analog conversion circuit forming a single line driver includes first and second conversion transistors a current transistor first through sixth current-supply transistors first through sixth switching transistors and a reference-current generating transistor. The first conversion transistor and each of the first through sixth current-supply transistors form a current mirror circuit. The reference-current generating transistor, which forms a current mirror circuit with the first conversion transistor is provided. An output terminal of the reference-current generating transistor is connected to an input terminal of the digital-to-analog conversion circuit of the adjacent single line driver.

35 Claims, 6 Drawing Sheets

ELECTRONIC CIRCUIT, ELECTRONIC DEVICE, ELECTRO-OPTICAL APPARATUS, AND ELECTRONIC UNIT

BACKGROUND OF THE INVENTION

1. Field of Invention

The present invention relates to electronic circuits, electronic devices, electro-optical apparatuses, and electronic units.

2. Description of Related Art

Display apparatus using organic EL devices can be active-matrix display apparatus provided with driving transistors for individually controlling the organic EL device of each pixel circuit. This type of display apparatus is provided with a data-line drive circuit for outputting a data current corresponding to image data, which is digital data, to the pixel circuits via data lines. This data-line drive circuit contains single line drivers provided with a plurality of digital-to-analog conversion circuits, and the image data is converted into an analog signal in the digital-to-analog conversion circuits, and is then output to the pixel circuits via the data lines (see, for example, Japanese Unexamined Patent Application Publication No. 2000-122608).

SUMMARY OF THE INVENTION

Generally, the number of pixel circuits is very large, and thus, there are some cases in which a plurality of single line drivers are electrically connected to each other so as to form one data-line drive circuit. However, the single line drivers disadvantageously output different levels of data currents for the same image data due to characteristic variations of the transistors forming the digital-to-analog conversion circuits. As a result, the organic EL devices emit light with different luminance levels for the same image data depending on the single line drivers connected to the organic EL devices. Because of this problem, an electro-optical apparatus exhibiting an excellent display quality cannot be provided.

Accordingly, in view of the above-described problem, it is an object of the present invention to provide an electronic device, an electro-optical apparatus, and an electronic unit in which characteristic variations of transistors can be suppressed.

An electronic circuit of the present invention can include a diode-connected first transistor provided with a first control terminal, a plurality of second transistors provided with second control terminals connected to the first control terminal, a plurality of third transistors, each being provided with a third control terminal connected to a signal line, connected in series with the corresponding second transistors, and a fourth transistor provided with a fourth control terminal connected to the first control terminal. A current path formed of the third transistors that are set in the ON state by ON signals supplied via the signal lines and the second transistors connected in series with the third transistors that are set in the ON state is connected to a single output terminal, and the fourth transistor is not connected to the single output terminal.

With such a configuration, the electronic circuit can be provided in which a digital-to-analog conversion circuit for outputting an analog current having a level corresponding to digital data supplied to the third transistors via the signal lines can be formed, and also, a current using the current of the first transistor as the reference value without depending on the analog current can be output.

In this electronic circuit, the gain coefficient of the fourth transistor may be the same as the gain coefficient of the first transistor. With this arrangement, the level of the analog current output from the fourth transistor can be the same as the level of the current flowing in the first transistor.

This electronic circuit may further include: a fifth transistor provided with a fifth control terminal and connected in series with the first transistor; and a diode-connected sixth transistor provided with a sixth control terminal connected to the fifth control terminal. With this arrangement, the level of the voltage generated at the first control terminal can be controlled by the level of the current flowing in the sixth transistor.

Another electronic circuit of the present invention can include a diode-connected first transistor provided with a first control terminal, a plurality of second transistors for outputting currents by using a voltage level of the first control terminal as a reference value, a plurality of third transistors, each being provided with a third control terminal, for controlling the currents output from the plurality of second transistors according to ON/OFF signals input into the third control terminals, and a fourth transistor provided with a fourth control terminal and outputting a current by using the voltage level of the first control terminal as the reference value. The current output from the fourth transistor does not flow in a current path in which the currents output from the plurality of second transistors flow.

With this configuration, the electronic circuit can be provided in which a digital-to-analog conversion circuit for outputting an analog current having a level corresponding to digital data supplied to the third transistors via the signal lines can be formed, and also, a current using the current of the first transistor as the reference value without depending on the analog current can be output.

Another electronic circuit of the present invention can include a diode-connected first transistor provided with a first control terminal, a plurality of second transistors for outputting currents by using a voltage level of the first control terminal as a reference value, a plurality of third transistors, each being provided with a third control terminal, for controlling the currents output from the plurality of second transistors according to ON/OFF signals input into the third control terminals, and a fourth transistor provided with a fourth control terminal and outputting a current by using the voltage level of the first control terminal as the reference value. The fourth transistor is not disposed in a current path formed of the third transistors that are set in the ON state by the ON/OFF signals and the second transistors connected in series with the third transistors that are set in the ON state.

With this configuration, the electronic circuit can be provided in which a digital-to-analog conversion circuit for outputting an analog current having a level corresponding to digital data supplied to the third transistors via the signal lines can be formed, and also, a current using the current of the first transistor as the reference value without depending on the analog current can be output.

In this electronic circuit, the gain coefficient of the fourth transistor may be the same as the gain coefficient of the first transistor. With this arrangement, the level of the analog current output from the fourth transistor can be the same as the level of the current flowing in the first transistor.

This electronic circuit may further include a fifth transistor provided with a fifth control terminal and connected in series with the first transistor, and a diode-connected sixth transistor provided with a sixth control terminal connected to the fifth control terminal. With this arrangement, the level of the voltage generated at the first control terminal can be controlled by the level of the current flowing in the sixth transistor.

An electronic device of the present invention can include a plurality of unit circuits. Each of the plurality of unit circuits can further include a diode-connected first transistor provided with a first control terminal, a plurality of second transistors provided with second control terminals connected to the first control terminal, a plurality of third transistors, each being provided with a third control terminal connected to a signal line, connected in series with the corresponding second transistors, and a fourth transistor provided with a fourth control terminal connected to the first control terminal, the fourth transistor not being disposed in a current path formed of the third transistors that are set in the ON state by ON signals supplied via the signal lines and the second transistors connected in series with the third transistors that are set in the ON state. The fourth transistor can be connected to another unit circuit via a connecting line so as to control a voltage level of the first control terminal contained in that unit circuit according to the level of a current output from the fourth transistor.

With this configuration, the current generated in one unit circuit can be used as the reference current. The reference current is then supplied to the first transistor of each of the other unit circuits so as to control the voltage of the first control terminal of the first transistor of each of the other unit circuits. The first transistor is driven based on this reference current as the reference value, thereby making it possible to suppress characteristic variations, for example, the threshold voltage, of the first transistors of the unit circuits. As a result, the current corresponding to the ON/OFF signals input into the third transistors can be output with high precision.

In this electronic device, the gain coefficient of the fourth transistor of each of the plurality of unit circuits may be the same as the gain coefficient of the first transistor. With this arrangement, the level of the current flowing in the first transistor of one unit circuit can be the same as the levels of the currents flowing in the first transistors of the other unit circuits.

In this electronic device, each of the plurality of unit circuits may further include: a fifth transistor provided with a fifth control terminal and connected in series with the first transistor; and a diode-connected sixth transistor provided with a sixth control terminal connected to the fifth control terminal. With this arrangement, the level of the voltage generated at the first control terminal can be controlled by the level of the current flowing in the sixth transistor.

Another electronic device of the present invention can also include a plurality of unit circuits. Each of the plurality of unit circuits can further include a diode-connected first transistor provided with a first control terminal, a plurality of second transistors for outputting currents by using a voltage level of the first control terminal as a reference value, a plurality of third transistors, each being provided with a third control terminal, for controlling the currents output from the plurality of second transistors according to ON/OFF signals input into the third control terminals, and a fourth transistor provided with a fourth control terminal and outputting a current by using the voltage level of the first control terminal as the reference value. The current output from the fourth transistor is supplied to another unit circuit without being supplied to a current path formed of the second transistors connected in series with the third transistors that are set in the ON state by the ON/OFF signals.

With this configuration, each unit circuit outputs an analog current having a level corresponding to the ON/OFF signals input into the third transistors, and also outputs a current, which is independent of the analog current, from the fourth transistor to another unit circuit. The other unit circuits set the voltages of the first control terminals of the first transistors contained in the corresponding unit circuits by using the current output from the fourth transistor as the reference current. Accordingly, characteristic variations of the first transistors of the unit circuits can be suppressed, thereby making it possible to control the analog currents output from the unit circuits with high precision.

Another electronic device of the present invention can include a plurality of unit circuits. Each of the plurality of unit circuits can further include a diode-connected first transistor provided with a first control terminal, a plurality of second transistors for outputting currents by using a voltage level of the first control terminal as a reference value, a plurality of third transistors, each being provided with a third control terminal, for controlling the currents output from the plurality of second transistors according to ON/OFF signals input into the third control terminals, and a fourth transistor provided with a fourth control terminal and outputting a current by using the voltage level of the first control terminal as the reference value. The current output from the fourth transistor serves as a reference current for setting a voltage level of the first control terminal of another unit circuit.

With this configuration, each unit circuit outputs an analog current having a level corresponding to the ON/OFF signals input into the third transistors, and also outputs a current, which is independent of the analog current, from the fourth transistor to another unit circuit. The other unit circuits set the voltages of the first control terminals of the first transistors contained in the corresponding unit circuits by using the current output from the fourth transistor as the reference current. Accordingly, characteristic variations of the first transistors of the unit circuits can be suppressed, thereby making it possible to control the analog currents output from the unit circuits with high precision.

In this electronic device, the gain coefficient of the fourth transistor of each of the plurality of unit circuits may be the same as the gain coefficient of the first transistor. With this arrangement, the level of the current flowing in the first transistor of one unit circuit can be used as the reference current for the other unit circuits.

In this electronic device, the plurality of unit circuits may be cascade-connected. With this arrangement, the analog currents generated in the cascade-connected unit circuits can be controlled with high precision by the ON/OFF signals input into the third control terminals.

In this electronic device, each of the plurality of unit circuits may further include: a fifth transistor provided with a fifth control terminal and connected in series with the first transistor and a diode-connected sixth transistor provided with a sixth control terminal connected to the fifth control terminal. With this arrangement, the level of the voltage generated at the first control terminal can be controlled by the level of the current flowing in the sixth transistor.

Another electronic device of the present invention can include a plurality of unit circuits. Each of the plurality of unit circuits can further include a diode-connected first transistor provided with a first control terminal, a plurality of second transistors for outputting currents by using a voltage level of the first control terminal as a reference value, a plurality of third transistors, each being provided with a third control terminal, for controlling the currents output from the plurality of second transistors according to ON/OFF signals input into the third control terminals, a fourth transistor provided with a fourth control terminal and outputting a current by using the voltage level of the first control terminal as the reference value, a fifth transistor provided with a fifth control terminal and connected in series with the first transistor, and a diode-connected sixth transistor provided with a sixth control terminal connected to the fifth control terminal. The fourth transistor is not connected to the second transistors connected in series with the third transistors that are set in the ON state by the ON/OFF signals of the unit circuit containing the fourth transistor, but is connected to the sixth transistor contained in another unit circuit.

With this configuration, each unit circuit outputs an analog current having a level corresponding to the ON/OFF signals input into the third transistors, and also outputs a current, which is independent of the analog current, from the fourth transistor to another unit circuit. The other unit circuits supply the current output from the fourth transistor to the sixth transistors contained in the corresponding unit circuits as the reference current. Then, the voltage at the first control terminal of the first transistor is set by the reference current flowing in the sixth transistor. Accordingly, characteristic variations of the first transistors of the unit circuits can be suppressed, thereby making it possible to control the analog currents output from the unit circuits with high precision.

In this electronic device, the gain coefficient of the fourth transistor of each of the plurality of unit circuits may be the same as the gain coefficient of the first transistor. With this arrangement, the level of the current flowing in the first transistor of one unit circuit can be the same as the levels of the currents flowing in the first transistors of the other unit circuits.

In this electronic device, the plurality of unit circuits may be cascade-connected. With this arrangement, the analog currents generated in the cascade-connected unit circuits can be controlled with high precision by the ON/OFF signals input into the third control terminals.

An electro-optical apparatus of the present invention can include a plurality of scanning lines, a plurality of data lines, electro-optical devices disposed at the intersections between the plurality of scanning lines and the plurality of data lines, and a data-current supply circuit for supplying a data current to the plurality of data lines, so as to supply a drive current having an amount corresponding to the data current to each of the electro-optical devices. The data-current supply circuit can also include a diode-connected first transistor provided with a first control terminal, a plurality of second transistor provided with second control terminals connected to the first control terminal, a plurality of third transistors, each being provided with a third control terminal connected to a signal line through which image data is supplied, connected in series with the corresponding second transistors, and a fourth transistor provided with a fourth control terminal connected to the first control terminal. The fourth transistor is connected to another data-current supply circuit via a connecting line so as to control a voltage level of the first control terminal contained in that data-current supply circuit according to the level of a current output from the fourth transistor.

With this configuration, a digital-to-analog conversion circuit for outputting an analog current having a level corresponding to the image data can be formed, and also a current using the current of the first transistor as the reference value without depending on the analog current can be output. Accordingly, characteristic variations of the first transistors of the unit circuits can be suppressed, thereby making it possible to output the analog currents having levels corresponding to the image data with high precision. As a result, an electro-optical apparatus having an excellent display quality can be provided.

In this electro-optical apparatus, the gain coefficient of the fourth transistor may be the same as the gain coefficient of the first transistor. With this arrangement, the level of the current flowing in the first transistor of one unit circuit can be the same as the levels of the currents flowing in the first transistors of the other unit circuits.

In this electro-optical apparatus, the data-current supply circuit may further include a fifth transistor provided with a fifth control terminal and connected in series with the first transistor, and a diode-connected sixth transistor provided with a sixth control terminal connected to the fifth control terminal. With this arrangement, the level of the voltage generated at the first control terminal can be controlled by the level of the current flowing in the sixth transistor.

Another electro-optical apparatus of the present invention can include a plurality of scanning lines, a plurality of data lines, electro-optical devices disposed at the intersections between the plurality of scanning lines and the plurality of data lines, and data-current supply circuits for supplying data currents to the plurality of data lines, so as to supply a drive current having an amount corresponding to the data current to each of the electro-optical devices. Each of the data-current supply circuit may include a diode-connected first transistor provided with a first control terminal, a plurality of second transistors for outputting currents by using a voltage level of the first control terminal as a reference value, a plurality of third transistors, each being provided with a third control terminal, for controlling the currents output from the plurality of second transistors according to image data input into the third control terminals, and a fourth transistor provided with a fourth control terminal and outputting a current by using the voltage level of the first control terminal as the reference value. The current output from the fourth transistor is supplied to another unit circuit without being supplied to a current path formed of the second transistors connected in series with the third transistors that are set in the ON state by the image data.

With this configuration, each unit circuit outputs an analog current having a level corresponding to the ON/OFF signals input into the third transistors, and also outputs a current, which is independent of the analog current, from the fourth transistor to another unit circuit. The other unit circuits set the voltages of the first control terminals of the first transistors contained in the other unit circuits by using the current output from the fourth transistor as the reference current. Accordingly, characteristic variations of the first transistors of the unit circuits can be suppressed, thereby making it possible to control the analog currents output from the unit circuits with high precision. As a result, an electro-optical apparatus having an excellent display quality can be provided.

Another electro-optical apparatus of the present invention can include a plurality of scanning lines, a plurality of data lines, electro-optical devices disposed at the intersections between the plurality of scanning lines and the plurality of data lines, and data-current supply circuits for supplying data currents to the plurality of data lines, so as to supply a drive current having an amount corresponding to the data current to each of the electro-optical devices. Each of the data-current supply circuit may also include a diode-connected first transistor provided with a first control terminal; a plurality of second transistors for outputting currents by using a voltage level of the first control terminal as a reference value, a plurality of third transistors, each being provided with a third control terminal, for controlling the currents output from the plurality of second transistors according to image data input into the third control terminals, and a fourth transistor provided with a fourth control terminal and outputting a current by using the voltage level of the first control terminal as the reference value. The current output from the fourth transistor serves as a reference current for setting a voltage level of the first control terminal of another unit circuit.

With this configuration, each unit circuit outputs an analog current having a level corresponding to the ON/OFF signals input into the third transistors, and also outputs a current, which is independent of the analog current, from the fourth transistor to another unit circuit. The other unit circuits set the voltages of the first control terminals of the first transistors contained in the other unit circuits by using the current output from the fourth transistor as the reference current. Accordingly, characteristic variations of the first transistors of the unit circuits can be suppressed, thereby making it possible to control the analog currents output from the unit circuits with high precision. As a result, an electro-optical apparatus having an excellent display quality can be provided.

In this electro-optical apparatus, the gain coefficient of the fourth transistor of each of the plurality of data-current supply circuits may be the same as the gain coefficient of the first transistor. With this arrangement, the level of the current flowing in the first transistor of one unit circuit can be the same as the levels of the currents flowing in the first transistors of the other unit circuits.

In this electro-optical apparatus, the plurality of data-current supply circuits may be cascade-connected. With this arrangement, the analog currents generated in the cascade-connected data-current supply circuits can be controlled with high precision by the ON/OFF signals input into the third control terminals.

In this electro-optical apparatus, each of the current-supply circuits may further include: a fifth transistor provided with a fifth control terminal and connected in series with the first transistor; and a diode-connected sixth transistor provided with a sixth control terminal connected to the fifth control terminal. With this arrangement, the level of the voltage generated at the first control terminal can be controlled by the level of the current flowing in the sixth transistor.

Another electro-optical apparatus of the present invention can include a plurality of scanning lines, a plurality of data lines, electro-optical devices disposed at the intersections between the plurality of scanning lines and the plurality of data lines, and data-current supply circuits for supplying data currents to the plurality of data lines, so as to supply a drive current having an amount corresponding to the data current to each of the electro-optical devices. Each of the data-current supply circuit can further include a diode-connected first transistor provided with a first control terminal, a plurality of second transistors for outputting currents by using a voltage level of the first control terminal as a reference value, a plurality of third transistors, each being provided with a third control terminal, for controlling the currents output from the plurality of second transistors according to ON/OFF signals input into the third control terminals, a fourth transistor provided with a fourth control terminal and outputting a current by using the voltage level of the first control terminal as the reference value, a fifth transistor provided with a fifth control terminal and connected in series with the first transistor, and a diode-connected sixth transistor provided with a sixth control terminal connected to the fifth control terminal. The fourth transistor is not connected to the second transistors connected in series with the third transistors that are set in the ON state by the ON/OFF signals of a unit circuit containing the fourth transistor, but is connected to the sixth transistor contained in another unit circuit.

With this configuration, each unit circuit outputs an analog current having a level corresponding to the ON/OFF signals input into the third transistors, and also outputs a current, which is independent of the analog current, from the fourth transistor to another unit circuit. The other unit circuits supply the current output from the fourth transistor to the sixth transistors contained in the other unit circuits as the reference current. Then, the voltage at the first control terminal of the first transistor is set by the reference current flowing in the sixth transistor. Accordingly, characteristic variations of the first transistors of the unit circuits can be suppressed, thereby making it possible to control the analog currents output from the unit circuits with high precision. As a result, an electro-optical apparatus having an excellent display quality can be provided.

In this electro-optical apparatus, the gain coefficient of the fourth transistor of each of the data-current supply circuits may be the same as the gain coefficient of the first transistor. With this arrangement, the level of the current flowing in the first transistor of one unit circuit can be the same as the levels of the currents flowing in the first transistors of the other unit circuits.

In this electro-optical apparatus, the plurality of data-current supply circuits may be cascade-connected. With this arrangement, the analog currents generated in the cascade-connected unit circuits can be controlled with high precision according to the ON/OFF signals input into the third control terminals.

In this electro-optical apparatus, the data-current supply circuit may further include a fifth transistor provided with a fifth control terminal and connected in series with the first transistor, and a diode-connected sixth transistor provided with a sixth control terminal connected to the fifth control terminal. With this arrangement, the level of the voltage generated at the first control terminal can be controlled by the level of the current flowing in the sixth transistor.

In this electro-optical apparatus, the gain coefficient of the sixth transistor may be the same as the gain coefficient of the first transistor. With this arrangement, the level of the voltage generated at the first control terminal can be controlled by the level of the current flowing in the sixth transistor.

In this electro-optical apparatus, the electro-optical devices may be EL devices. With this arrangement, the display quality of an electro-optical apparatus provided with EL devices can be improved.

In this electro-optical apparatus, the EL devices may each include a light-emission layer formed of an organic material. With this arrangement, the display quality of an electro-optical apparatus provided with organic EL devices can be improved.

An electronic unit of the present invention is equipped with the above-described electronic device. With this configuration, an electronic unit that can perform controlling with high precision according to digital data can be provided.

An electronic unit of the present invention is equipped with the above-described electro-optical apparatus. With this configuration, an electro-optical apparatus having an excellent display quality can be provided.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Figure 1:
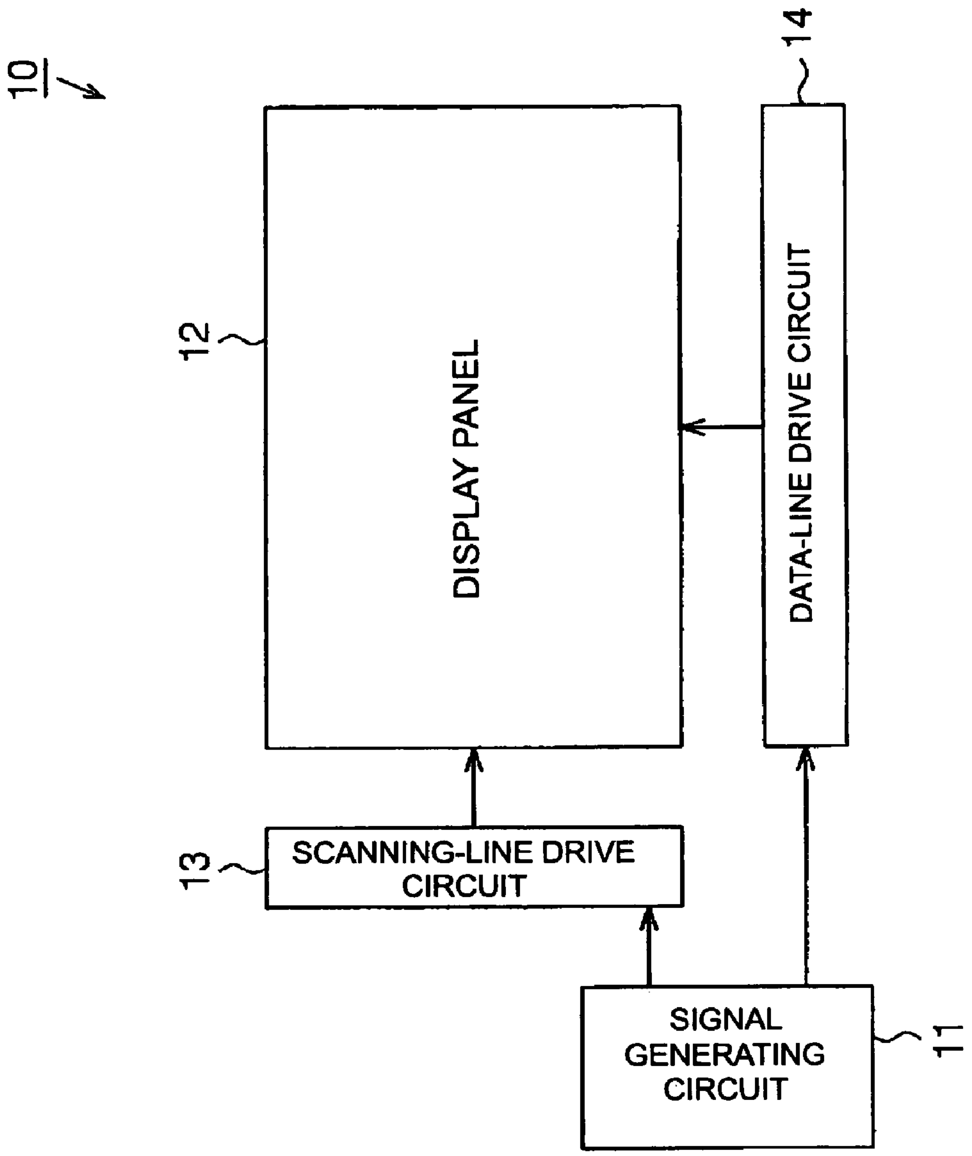
FIG. 1 is an exemplary circuit block diagram illustrating the electrical configuration of an organic EL display of a first embodiment.
Figure 2:
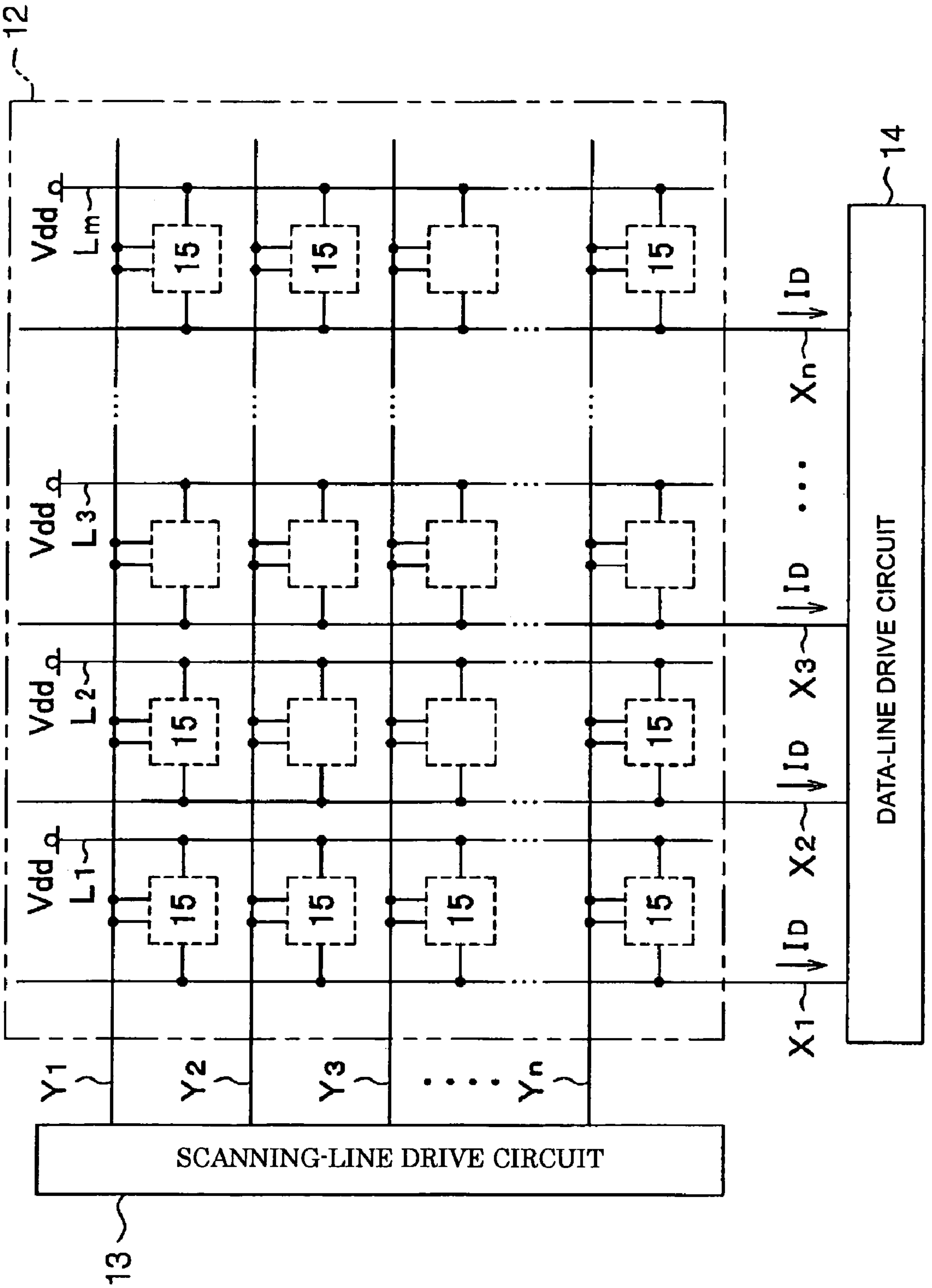
FIG. 2 is an exemplary circuit block diagram indicating the circuit configuration of a display panel.
Figure 3:
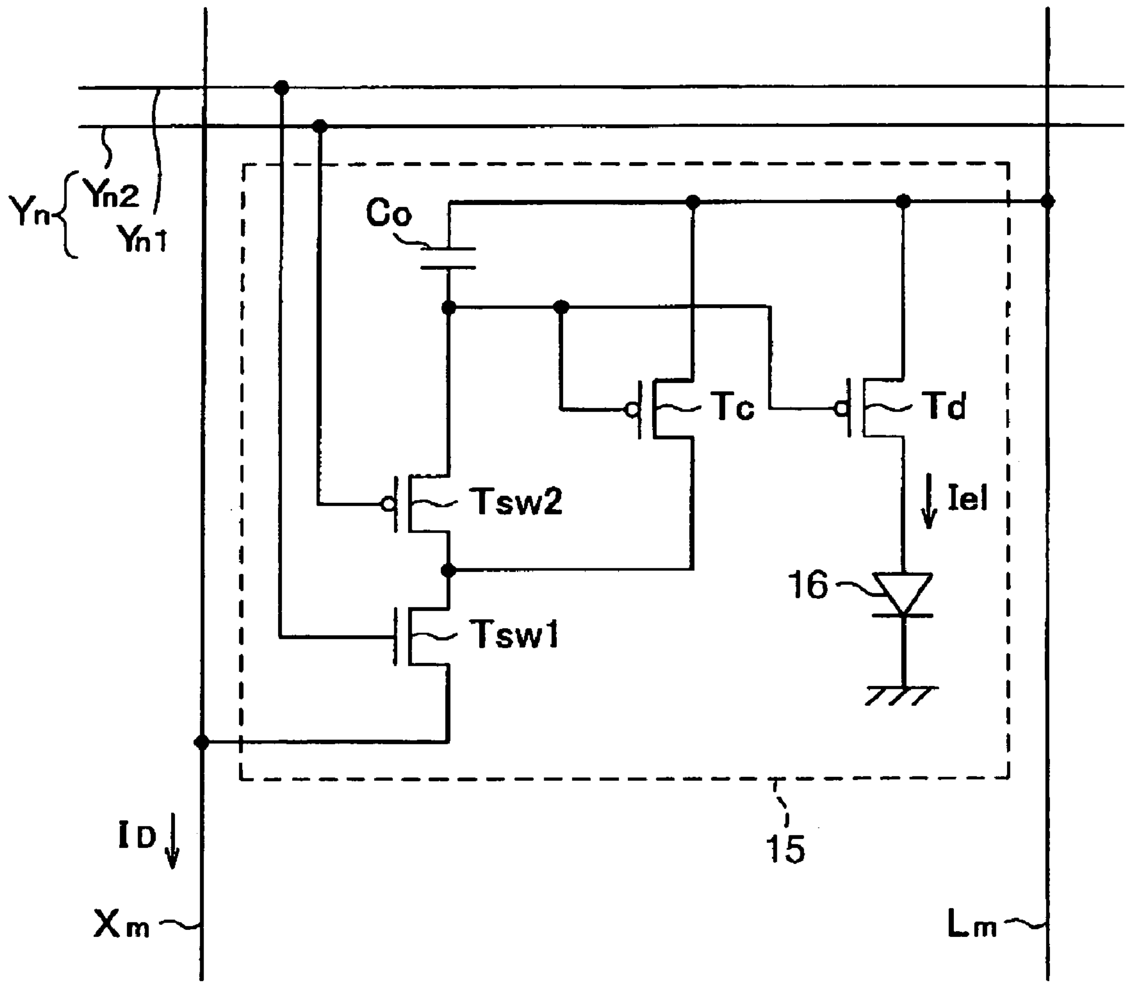
FIG. 3 is an exemplary circuit diagram illustrating a pixel circuit.

A first embodiment of the present invention is described below with reference to FIGS. 1 through 5. FIG. 1 is an exemplary circuit block diagram illustrating the electrical configuration of an organic EL display. FIG. 2 is an exemplary circuit block diagram illustrating the circuit configuration of a display panel. FIG. 3 is an exemplary circuit diagram illustrating a pixel circuit.

An organic EL display 10 can include a signal generating circuit 11, a display panel 12, a scanning-line drive circuit 13, and a data-line drive circuit 14. The organic EL display 10 of this embodiment is an active-matrix-driving organic EL display.

The signal generating circuit 11, the scanning-line drive circuit 13, and the data-line drive circuit 14 of the organic EL display 10 may be formed of independent electronic components. For example, each of the signal generating circuit 11, the scanning-line drive circuit 13, and the data-line drive circuit 14 may be formed of a one-chip semiconductor integrated circuit. Alternatively, part of or all of the signal generating circuit 11, the scanning-line drive circuit 13, and the data-line drive circuit 14 may be formed as a programmable IC chip, and the functions of these elements may be implemented by a software program written into the IC chip.

The signal generating circuit 11 generates a scanning control signal and a data control signal for displaying an image on the display panel 12 based on an image control signal output from an external device (not shown). The signal generating circuit 11 then outputs the scanning control signal and the data control signal to the scanning-line drive circuit 13 and the data-line drive circuit 14, respectively. In this embodiment, the data control signal is image digital data, which is 6-bit image data or image signal.

As shown in FIG. 2, the display panel 12 can include n scanning lines Y1, Y2, . . . , Yn extending in the row direction, and also includes m data lines X1, X2, . . . , Xm extending in the column direction.

In the display panel 12, pixel circuits 15 are disposed at the intersections between the scanning lines Y1, Y2, . . . , Yn and the data lines X1, X2, . . . , Xm. The pixel circuits 15 are connected to the scanning-line drive circuit 13 via the scanning lines Y1, Y2, . . . Yn, and are also connected to the data-line drive circuit 14 via the data lines X1, X2, . . . , Xm. The m data lines X1, X2, . . . , Xm are divided into i groups, and a predetermined number (j) of data lines are allocated to each divided group. For convenience of description, the m data lines X1, X2, . . . , Xm can be indicated by data lines Xi.1, Xi.2, . . . , Xi.j for differentiating them from the data lines of the other groups. It is now assumed that the data lines X1.1, X1.2, . . . , X1.j, X2.1, X2.2 . . . , X2.j, Xi.1, Xi.2, . . . , Xi.j are sequentially arranged in this order from the left to the right in FIG. 2. The pixel circuits 15 are connected to power supply lines L1, L2, . . . , Lm extending in the column direction. The power supply lines L1, L2, . . . , Lm each supply a drive voltage Vdd to a conversion transistor Tc and a driving transistor Td forming the pixel circuit 15, which are described below.

FIG. 3 is an exemplary circuit diagram illustrating the pixel circuit 15 disposed at the intersection between the m-th data line Xm(i,j) and the n-th scanning line Yn. The pixel circuit 15 can include an organic EL device 16 having a light-emission layer formed of an organic material, a driving transistor Td, first and second switching transistors Tsw1 and Tsw2, a conversion transistor Tc, and a storage capacitor Co. The driving transistor Td, the conversion transistor Tc, and the second switching transistor Tsw2 are p-type TFTs, and the first switching transistor Tsw1 is an n-type TFT.

The drain of the driving transistor Td is connected to the anode of the organic EL device 16. The cathode of the organic EL device 16 is grounded. The gate of the driving transistor Td is connected to the gate of the conversion transistor Tc. The source of the driving transistor Td is connected to the source of the conversion transistor Tc. The source of the driving transistor Td is also connected to the m-th power supply line Lm for supplying the drive voltage Vdd. The storage capacitor Co is connected between the source and the gate of the driving transistor Td. That is, the conversion transistor Tc and the driving transistor Td form a current mirror circuit.

The drain of the conversion transistor Tc is connected to the m-th data line Xm(Xi,j) via the first switching transistor Tsw1. The drain of the conversion transistor Tc is also connected to the storage capacitor Co via the second switching transistor Tsw2.

The gate of the first switching transistor Tsw1 is connected to the first sub-scanning line Yn1 of the n-th scanning line. The gate of the second switching transistor Tsw2 is connected to the second sub-scanning line Yn2 of the n-th scanning line. The first sub-scanning line Yn1 and the second sub-scanning line Yn2 form the n-th scanning line Yn.

Although in this embodiment the pixel circuit 15 is formed of the organic EL device 16, the driving transistor Td, the first and second switching transistors Tsw1 and Tsw2, the conversion transistor Tc, and the storage capacitor Co, it is not restricted to this arrangement, and the components forming the pixel circuit 15 may be suitably changed.

The scanning-line drive circuit 13 selects one scanning line from among the n scanning lines Y1, Y2, . . . , Yn provided on the display panel 12 based on the above-described scanning control signal output from the signal generating circuit 11, and outputs a scanning signal to the selected scanning line. By outputting the scanning signal, the scanning-line drive circuit 13 controls the timing with which the organic EL device 16 of the pixel circuit 15 emits light and the timing with which electrical charge corresponding to a data current ID, which is described below, is written into the storage capacitor Co.

The data-line drive circuit 14 generates the data current ID based on the above-described image digital data output from the signal generating circuit 11, and also supplies the generated data current ID to the corresponding data lines X1, X2, . . . , Xm. The data current ID is then output to the pixel circuits 15 via the corresponding data lines X1, X2, . . . , Xm.

In each of the pixel circuits 15 on the scanning lines Y1, Y2, . . . , Yn selected by the scanning signal output from the scanning-line drive circuit 13, the first and second switching transistors Tsw1 and Tsw2 are set in the ON state. Accordingly, electrical charge corresponding to the data current ID output from the data-line drive circuit 14 is written into the storage capacitor Co via the first and second switching transistors Tsw1 and Tsw2. Subsequently, the scanning signal output from the scanning-line drive circuit 13 sets the second switching transistor Tsw2 in the OFF state.

Then, a current corresponding to the electrical charge written into the storage capacitor Co flows in the conversion transistor Tc. Then, a drive current Ie1 having a level corresponding to that current flows in the driving transistor Td, which forms a current mirror circuit with the conversion transistor Tc. This allows the organic EL device 16 to emit light with a luminance level associated with the drive current Ie1. Normally, for achieving a faster writing speed, the level of the data current ID (flowing in the conversion transistor Tc) is set to be greater than that of the drive current (flowing in the driving transistor Td). That is, the gain coefficient of the conversion transistor Tc is different from that of the driving transistor Td. Accordingly, the current flowing in the driving transistor Td is determined by the ratio of the gain coefficients.

Details of the data-line drive circuit 14 of the organic EL display 10 constructed as described above are given below with reference to FIGS. 4 and 5.

Figure 4:
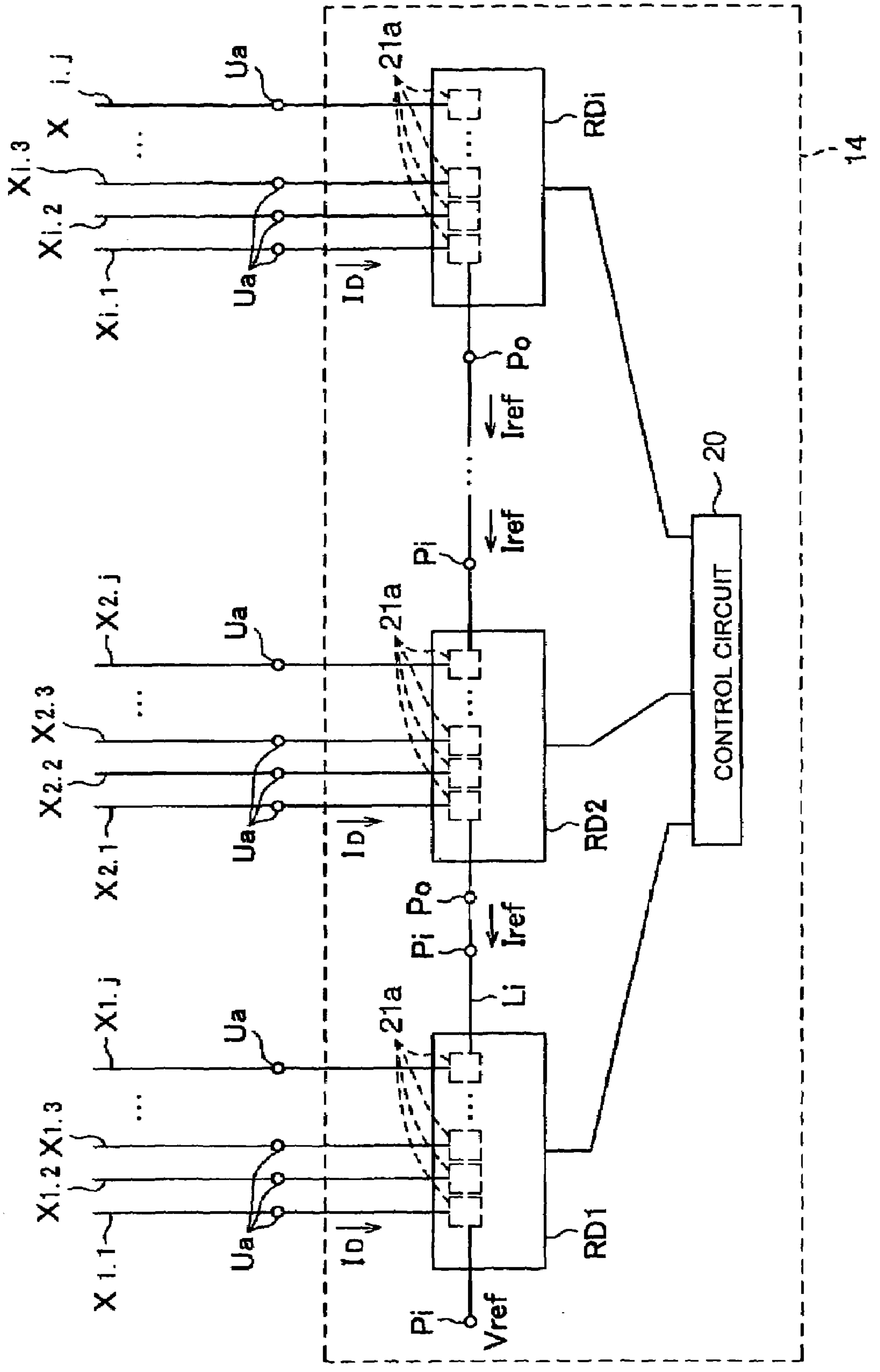
FIG. 4 illustrates the internal configuration of a data-line drive circuit.

FIG. 4 illustrates the internal configuration of the data-line drive circuit 14. The data-line drive circuit 14 can include, as shown in FIG. 4, a control circuit 20 and a plurality of (in this embodiment, the number i, which is the number of groups divided from the data lines X1, X2, . . . , Xm) single line drivers RD1 through RDi. The control circuit 20 is electrically connected to each of the i single line drivers RD1 through RDi. The control circuit 20 supplies the above-described 6-bit image digital data output from the signal generating circuit 11 to each of the single line drivers RD1 through RDi.

The single line drivers RD1 through RDi are provided in association with the corresponding divided groups. The single line drivers RD1 through RDi are cascade-connected with each other via a connecting line Li. The data lines X1.1 through X1.j are connected to the first single line driver RD1 via analog output terminals Ua, the data lines X2.1 through X2.j are connected to the second single line driver RD2 via the analog output terminals Ua, and the data lines Xi.1 through Xi.j are connected to the i-th single line driver RDi via the analog output terminals Ua. In this embodiment, the first single line driver RD1 connected to the data lines X1.1 through X1.j is referred to as a "master driver", and the second through i-th single line drivers RD2 through RDi are referred to as "slave drivers".

Each of the single line drivers RD1 through RDi can be provided with the same number of digital-to-analog conversion circuits 21*a* as the number (j) of data lines of each group. The j digital-to-analog conversion circuits 21*a* are cascade-connected with each other. A reference voltage Vref is supplied to an input terminal Pi of the digital-to-analog conversion circuit 21*a* connected to the data line X1.1 of the first single line driver RD1.

Figure 5:
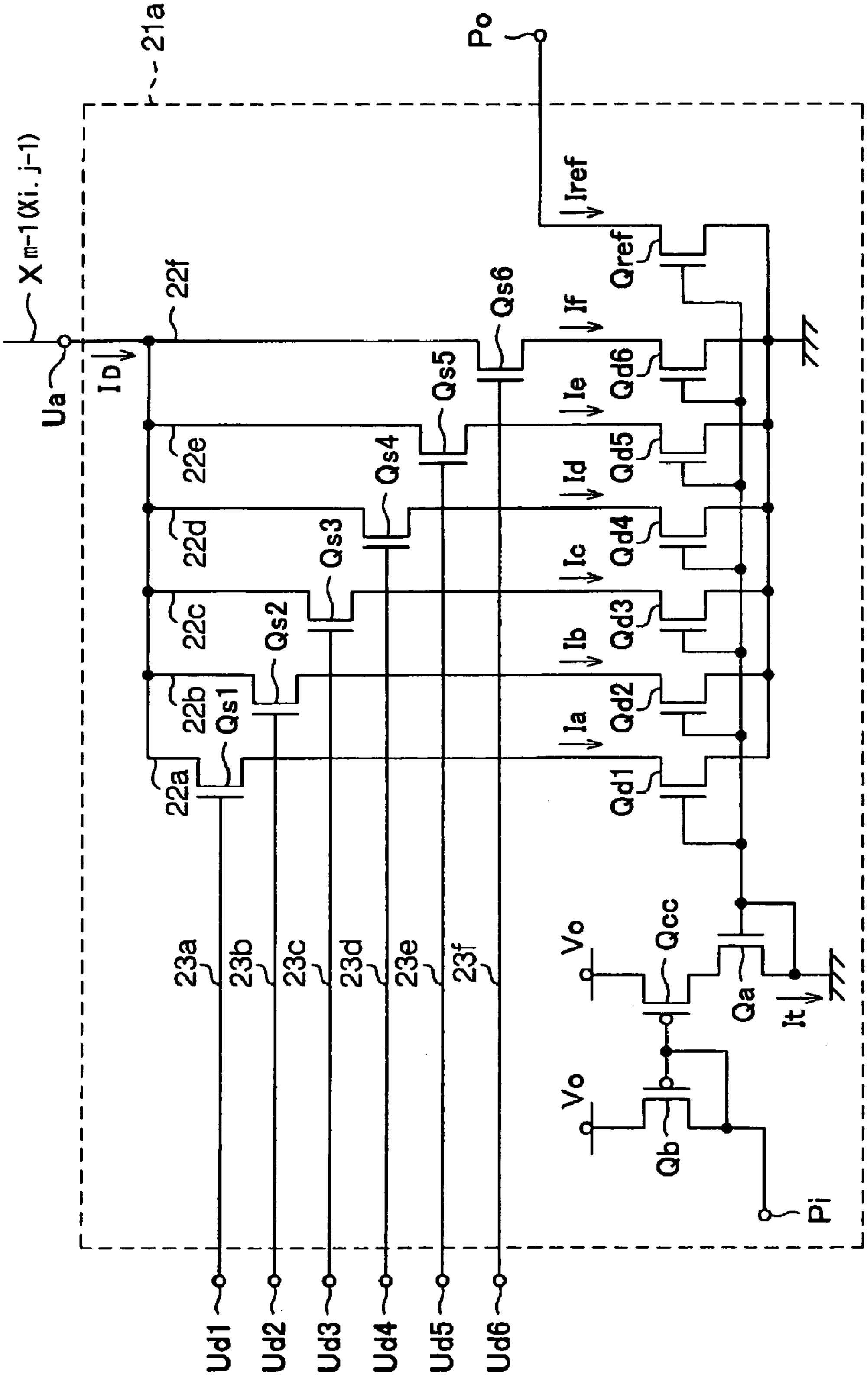
FIG. 5 is an exemplary circuit diagram illustrating a digital-to-analog conversion circuit.

The digital-to-analog conversion circuit 21*a* is described below with reference to FIG. 5. The circuit configurations of the digital-to-analog conversion circuits 21*a* provided for the single line drivers RD1 through RDi are substantially the same. Accordingly, for convenience of description, the digital-to-analog conversion circuit 21*a* connected to the (m-1)-th data line Xm-1(Xi,j-1) is discussed.

In this embodiment, the digital-to-analog conversion circuit 21*a* is a 6-bit current-output digital-to-analog conversion circuit. The digital-to-analog conversion circuit 21*a* includes first and second conversion transistors Qa and Qb, a current transistor Qcc, first through sixth current supply transistors Qd1 through Qd6, first through sixth switching transistors Qs1 through Qs6, and a reference-current generating transistor Qref. The digital-to-analog conversion circuit 21*a* also includes six analog signal lines 22*a* through 22*f* and six digital signal lines 23*a* through 23*f*.

The first and second conversion transistors Qa and Qb, the first through sixth current supply transistors Qd1 through Qd6, the current transistor Qcc, and the reference-current generating transistor Qref serve as constant current sources for outputting predetermined current levels. The first through sixth switching transistors Qs1 through Qs6 serve as switching devices that are controlled to be ON or OFF according to the image digital data. In this embodiment, the first conversion transistor Qa, the first through sixth current supply transistors Qd1 through Qd6, the first through sixth switching transistors Qs1 through Qs6, and the reference-current generating transistor Qref are an n- conductivity type. The second conversion transistor Qb and the current transistor Qcc are a p-conductivity type.

The analog signal lines 22*a* through 22*f* are disposed in parallel with each other, and one end of each of the analog signal lines 22*a* through 22*f* is connected to the analog output terminal Ua. The analog output terminal Ua is connected to the data line Xm-1(Xi,j-1).

The analog signal lines 22*a* through 22*f* are connected to the drains of the first through sixth switching transistors Qs1 through Qs6, respectively. The gates of the first through sixth switching transistors Qs1 through Qs6 are respectively connected to first through sixth digital input terminals Ud1 through Ud6 via the first through sixth digital signal lines 23*a* through 23*f*. The first through sixth digital input terminals Ud1 through Ud6 are connected to the control circuit 20. The first through sixth switching transistors Qs1 through Qs6 are controlled to be ON or OFF according to the above-described image digital data output from the control circuit 20, which is described below.

The sources of the first through sixth switching transistors Qs1 through Qs6 are connected to the drains of the first through sixth current supply transistors Qd1 through Qd6, respectively. The sources of the first through sixth current supply transistors Qd1 through Qd6 are grounded. That is, a current path formed of the first through sixth switching transistors Qs1 through Qs6 and the first through sixth current supply transistors Qd1 through Qd6 is connected to the analog output terminal Ua.

The levels of currents flowing in the first through sixth current supply transistors Qd1 through Qd6 are determined by the corresponding gain coefficients β. The relative ratio of the gain coefficients β of the first through sixth current supply transistors Qd1 through Qd6 is set to be 1:2:4:8:16:32, respectively. The gain coefficient β of transistors is defined by $\beta=(\mu CW/L)$, where μ indicates the carrier mobility, C represents the gate capacitance, W indicates the channel width, and L designates the channel length. Accordingly, the current-driving capacity ratio of the first through sixth current supply transistors Qd1 through Qd6 results in 1:2:4:8:16:32, respectively, and the relationship of the levels of the currents Ia through If output from the first through sixth current supply transistors Qd1 through Qd6 is as follows.

$$Ia=Ib/2=Ic/4=Id/8=Ie/16=If/32$$

The first through sixth switching transistors Qs1 through Qs6 are associated with the bits of the above-described 6-bit image digital data output from the control circuit 20. For example, the lowest bit of the image digital data is supplied to the first switching transistor Qs1 having the smallest gain coefficient (i.e., the relative value of β is 1), and the highest bit of the image digital data is supplied to the sixth switching transistor Qs6 having the largest gain coefficient (i.e., the relative value of β is 32).

The gates of the first through sixth current supply transistors Qd1 through Qd6 are connected to each other, and are connected to the gate of the diode-connected first conversion transistor Qa.

Accordingly, the first conversion transistor Qa forms a current mirror circuit with each of the first through sixth current supply transistors Qd1 through Qd6. That is, the first through sixth current supply transistors Qd1 through Qd6 output currents Ia through If, respectively, based on the voltage level of the gate of the first conversion transistor Qa as the reference value. In this embodiment, the gain coefficient of the first conversion transistor Qa is the same as that of the first current supply transistor Qd1. Thus, the current having the same level as the current It flowing in the first conversion current transistor Qa flows in the first current supply transistor Qd1 as the current Ia.

The source of the first conversion transistor Qa is grounded. The drain of the first conversion transistor Qa is connected to the drain of the current transistor Qcc. A power supply voltage Vo is supplied to the source of the current transistor Qcc. That is, the first conversion transistor Qa is connected in series with the current transistor Qcc.

The gate of the current transistor Qcc is connected to the gate of the diode-connected second conversion transistor Qb. The power supply voltage Vo is supplied to the source of the second conversion transistor Qb. The input terminal Pi is connected to the drain of the second conversion transistor Qb. Accordingly, the current transistor Qcc and the second conversion transistor Qb form a current mirror circuit. That is, the current transistor Qcc outputs a current based on the level of the gate voltage of the second conversion transistor Qb as the reference value.

The reference voltage Vref is supplied to the input terminal Pi, and simultaneously, the image digital data is input into the first through sixth digital input terminals Ud1 through Ud6. Then, the first through sixth switching transistors Qs1 through Qs6 are controlled to be ON or OFF according to the input image data. In other words, the first through sixth switching transistors Qs1 through Qs6 respectively control the currents Ia through If output from the first through sixth current supply transistors Qd1 through Qd6.

Subsequently, the currents Ia through If output from the first through sixth current supply transistors Qd1 through Qd6, respectively, according to the image digital data are superimposed on each other so as to output the data current ID having a level corresponding to the image digital data from the analog output terminal Ua. That is, the digital-to-analog conversion circuit 21*a* is able to control the organic EL device 16 with 64 grayscale levels according to the 6-bit image digital data.

In the digital-to-analog conversion circuit 21*a*, the reference-current generating transistor Qref, which forms a current mirror circuit with the first conversion transistor Qa, is formed. More specifically, the source of the reference-current generating transistor Qref is connected to the sources of the first through sixth current supply transistors Qd1 through Qd6. The drain of the reference-current generating transistor Qref is connected to an output terminal Po. The drain of the reference-current generating transistor Qref is connected via the output terminal Po to the input terminal Pi of the adjacent digital-to-analog conversion circuit 21*a*. That is, the reference-current generating transistor Qref is not disposed in a current path consisting of the first through sixth switching transistors Qs1 through Qs6 and the first through sixth current supply transistors Qd1 through Qd6 through which the currents Ia through If flow. Accordingly, the reference current Iref output from the reference-current generating transistor Qref is not supplied to the current path consisting of the first through sixth switching transistors Qs1 through Qs6 which are turned ON by the image data and the first through sixth current supply transistors Qd1 through Qd6 connected in series with the corresponding switching transistors. Instead, the reference current Iref is supplied to another digital-to-analog conversion circuit 21*a*.

The gain coefficient βref of the reference-current generating transistor Qref is set to be equal to the gain coefficient of the first conversion transistor Qa. Thus, the current level of the reference current Iref flowing in the reference-current generating transistor Qref is the same as that of the current flowing in the first conversion transistor Qa and the first current supply transistor Qd1.

As described above, the reference-current generating transistor Qref can output the reference current Iref having the same current level as that of the current flowing in the first current supply transistor Qd1 from the output terminal Po. The reference current Iref output from the output terminal Po is independent of the data current ID output from the analog output terminal Ua. The reference current Iref is then output via the connecting line Li to the second conversion transistor Qb of the digital-to-analog conversion circuit 21*a* connected to the data line Xm.

The reference current Iref output from the output terminal Po of the digital-to-analog conversion circuit 21*a* connected to the data line Xm-1 is supplied to the second conversion transistor Qb of the digital-to-analog conversion circuit 21*a* connected to the data line Xm. Then, the gate voltage of the current transistor Qcc of the digital-to-analog conversion circuit 21*a* is set according to the level of the current It flowing in the second conversion transistor Qb. Then, the voltage corresponding to the current It flowing in the first conversion transistor Qa is supplied to the reference-current generating transistor Qref as well as to the gates of the first through sixth current supply transistors Qd1 through Qd6.

Therefore, the first through sixth current supply transistors Qd1 through Qd6 provided in the digital-to-analog conversion circuit 21*a* connected to the data line Xm output the currents Ia through If, respectively, based on the reference current Iref flowing in the reference-current generating transistor Qref of the digital-to-analog conversion circuit 21*a* connected to the data line Xm-1. That is, the digital-to-analog conversion circuit 21*a* connected to the data line Xm can generate the data current ID based on the image digital data by using the reference current Iref flowing in the reference-current generating transistor Qref of the digital-to-analog conversion circuit 21*a* connected to the data line Xm-1 as the reference value.

As described above, the reference current Iref generated by one digital-to-analog conversion circuit 21*a* is used as the reference current Iref of the subsequent stage of the digital-to-analog conversion circuit 21*a*. More specifically, the reference current Iref generated by the first digital-to-analog conversion circuit 21*a* disposed in the first single line driver RD1 is used by the digital-to-analog conversion circuits 21*a* while maintaining its value, and is supplied until the final stage of the digital-to-analog conversion circuit 21*a* disposed in the i-th single line driver RDi. Thus, the output of different levels of data current ID for the same image digital data from the different single line drivers RD1 through RDi, which would be caused by variations of the characteristics, for example, the threshold voltage, of the first through sixth current supply transistors Qd1 through Qd6 of the digital-to-analog conversion circuits 21*a* can be prevented.

More specifically, characteristic variations are generated in the first through sixth current supply transistors Qd1 through Qd6 among the digital-to-analog conversion circuits 21*a* of the different single line drivers RD1 through RDi. Accordingly, when the reference voltage Vref is supplied as the reference value to the gates of the first through sixth current supply transistors Qd1 through Qd6 of the digital-to-analog conversion circuits 21*a* of the different single line drivers RD1 through RDi, different levels of the data current ID for the same image digital data are output from the single line drivers RD1 through RDi. In contrast, in the organic EL display 10 of the present invention, since all the single line drivers RD1 through RDi use the reference current Iref as the reference value, the first through sixth current supply transistors Qd1 through Qd6 are not influenced by the threshold voltage. As a result, different levels of the data current ID for the same image digital data are not output from the different single line drivers RD1 through RDi. Accordingly, the data current ID can be controlled with high precision according to the image digital data, thereby making it possible to improve the display quality of the organic EL display 10.

The digital-to-analog conversion circuit 21*a* configured, as described above, can be used for all the data lines X1 through Xm. More specifically, the reference voltage Vref is supplied to the input terminal of the digital-to-analog conversion circuit 21*a* connected to the first data line X1 of the master driver. On the other hand, the reference current Iref is supplied to the input terminals of the other digital-to-analog conversion circuits 21*a*. As a result, all the single line drivers RD1 through RDi can be manufactured with the same circuit configuration, and the manufacturing cost can be reduced.

The organic EL display 10, the digital-to-analog conversion circuit 21*a*, and the data-line drive circuit 14 correspond to the electro-optical apparatus, the electronic circuit, and the data-current supply circuit or the electronic device, respectively, set forth in claims. The first conversion transistor Qa and the second conversion transistor Qb correspond to the first transistor and the sixth transistor, respectively, set forth in claims. The first through sixth current supply transistors Qd1 through Qd6 and the first through sixth switching transistors Qs1 through Qs6 correspond to the plurality of second transistors and the plurality of third transistors, respectively, set forth in claims. The reference-current generating transistor Qref and the data current ID correspond to the fourth transistor and the drive current, respectively, set forth in claims.

The first through sixth digital signal lines 23*a* through 23*f* and the analog output terminal Ua correspond to the signal lines and the output terminal, respectively, set forth in claims. The gate of the second conversion transistor Qb, the gates of the second through sixth current supply transistors Qd2 through Qd6, and the gates of the first through sixth switching transistors Qs1 through Qs6 correspond to the first control terminal, second control terminals, and third control terminals, respectively, set forth in claims. The gate of the reference-current generating transistor Qref, the gate of the first current supply transistor Qd1, and the gate of the first conversion transistor Qa correspond to the fourth control terminal, fifth control terminal, and sixth control terminal, respectively, set forth in claims.

According to the organic EL display of the foregoing embodiment, the following features can be obtained.

In the above-described embodiment, in the digital-to-analog conversion circuits 21*a* of the single line drivers RD1 through RDi, the first conversion transistor Qa, which forms a current mirror circuit with each of the first through sixth current supply transistors Qd1 through Qd6, and the reference-current generating transistor Qref, which forms a current mirror circuit with the first conversion circuit Qa, are formed. Then, the gain coefficient βref of the reference-current generating transistor Qref is set to be equal to the gain coefficient of the first conversion transistor Qa. The output terminal Po of the reference-current generating transistor Qref of one single line driver is connected to the input terminal Pi of the digital-to-analog conversion circuits 21*a* of the adjacent single line drivers RD1 through RDi.

With this configuration, the digital-to-analog conversion circuits 21*a* of the single line drivers can output the data current ID according to the image digital data by using the reference current Iref as the reference value. In this case, the data current ID is not influenced by the threshold voltage of the first through sixth current supply transistors Qd1 through Qd6. As a result, different levels of the data current ID are not output from the different single line drivers RD1 through RDi for the same image digital data. Thus, the data current ID can be controlled with high precision according to the image digital data, thereby making it possible to improve the display quality of the organic EL display 10.

In the foregoing embodiment, the circuit configuration of the master drive for generating the reference current Iref and the circuit configurations of the slave drivers being driven by the reference current Iref are the same. Accordingly, the master driver and the slave drivers can be used in the same manner. As a result, the manufacturing cost of the single line drivers can be reduced.

Applications of the organic EL display 10, which serves as the electro-optical apparatus described in the first embodiment, to an electronic unit is described below with reference to FIG. 6. The organic EL display 10 can be used in various electronic units, for example, a mobile personal computer, a cellular telephone, and a digital camera.

Figure 6:
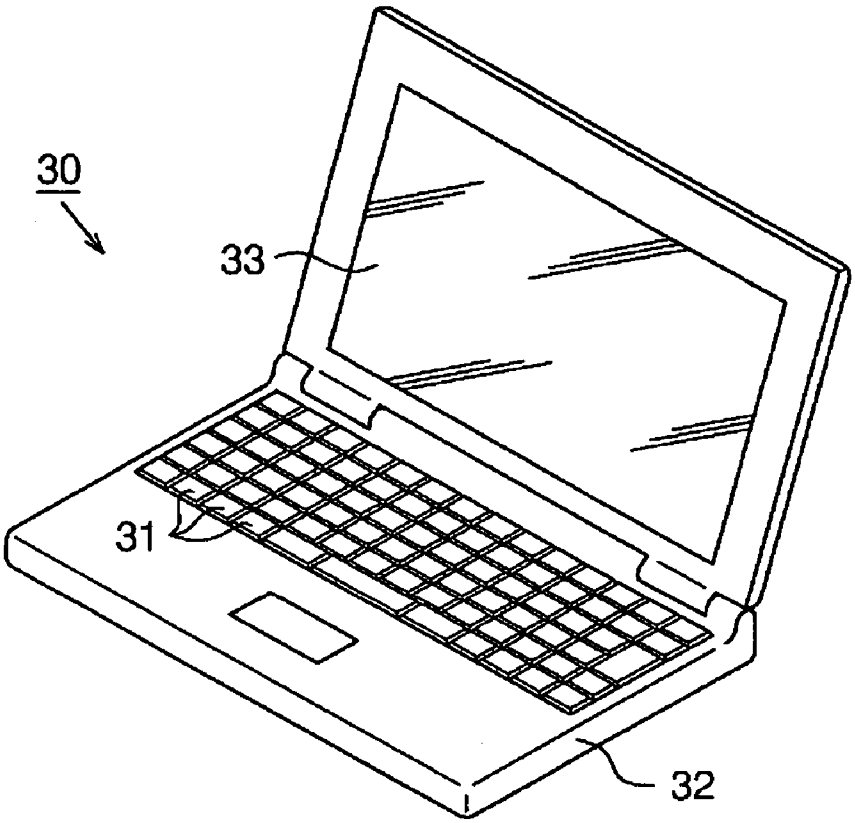
FIG. 6 is a perspective view illustrating the configuration of a mobile personal computer of a second embodiment.

FIG. 6 is a perspective view illustrating the configuration of a mobile personal computer. In FIG. 6, a personal computer 30 can include a main unit 32 provided with a keyboard 31 and a display unit 33 provided with the organic EL display 10.

In this case, too, the display quality of the display unit 33 using the organic EL display 10 can be improved.

It should be understood that the present invention is not restricted to the above-described embodiments, and may be carried out in the following modifications.

In the above-described embodiments, the image digital data has 6 bits, and the digital-to-analog conversion circuit 21*a* is set to be a 6-bit current-output digital-to-analog conversion circuit based on the 6-bit image digital data. The present invention may be applied to digital-to-analog conversion circuits other than a 6-bit digital-to-analog conversion circuit. With this modification, advantages similar to those described above can be obtained.

Although in the above-described embodiments the first conversion transistor Qa, and the first through sixth current supply transistors Qd1 through Qd6 constituting the digital-to-analog conversion circuit 21 a are an n-conductivity type, they may be a p-conductivity type. With this modification, advantages similar to those described above can be obtained.

In the foregoing embodiments, in the organic EL display 10, the pixel circuits 15 having the single-color organic EL devices 16 are provided. However, the present invention may be applied to an EL display provided with multi-color pixel circuits 15 having three-color (red, green, and blue) organic EL devices 16.

In the above-described embodiments, the present invention is applied to the pixel circuits 15 to achieve the advantages. However, it should be understood that the present invention may be applied to unit circuits for driving current drive devices, such as light-emitting devices, for example, LEDs or FEDs, other than the organic EL devices 16. Alternatively, the invention may be used for storage devices, for example, RAMs (in particular, MRAM).

Although in the first embodiment the organic EL devices 16 are employed as the current drive devices, inorganic EL devices may be used. That is, the present invention may be applied to an inorganic EL display having inorganic EL devices.

Thus, while this invention has been described in conjunction with specific embodiments thereof, it is evident that many alternatives, modifications, and variations will be apparent to those skilled in the art. Accordingly, preferred embodiments of the invention as set forth herein are intended to be illustrative, not limiting. Various changes may be made without departing from the spirit and scope of the invention.

What is claimed is:

1. An electronic circuit, comprising:

a diode-connected first transistor provided with a first control terminal;

a plurality of second transistors provided with second control terminals coupled to the first control terminal;

a plurality of third transistors, each being provided with a third control terminal coupled to a signal line, the third transistors being coupled in series with the corresponding second transistors; and a fourth transistor provided with a fourth control terminal coupled to the first control terminal, a current path formed of the third transistors that are set in the ON state by ON signals supplied via the signal lines and the second transistors coupled in series with the third transistors that are set in the ON state being coupled to a single output terminal, and the fourth transistor is not coupled to the single output terminal.

2. The electronic circuit according to claim 1, a gain coefficient of the fourth transistor being the same as a gain coefficient of the first transistor.

3. The electronic circuit according to claim 1, further comprising:

a fifth transistor provided with a fifth control terminal and coupled in series with the first transistor; and a diode-coupled sixth transistor provided with a sixth control terminal coupled to the fifth control terminal.

4. An electronic circuit, comprising:

a diode-connected first transistor provided with a first control terminal;

a plurality of second transistors that output currents by using a voltage level of the first control terminal as a reference value;

a plurality of third transistors, each being provided with a third control terminal, that control currents output from the plurality of second transistors according to ON/OFF signals input into the third control terminals; and a fourth transistor provided with a fourth control terminal and that outputs a current by using a voltage level of the first control terminal as the reference value, the current output from the fourth transistor not flowing in a current path in which the currents output from the plurality of second transistors flow.

5. The electronic circuit according to claim 4, further comprising:

a fifth transistor provided with a fifth control terminal and coupled in series with the first transistor; and a diode-connected sixth transistor provided with a sixth control terminal coupled to the fifth control terminal.

6. The electronic circuit according to claim 4, a gain coefficient of the fourth transistor being the same as gain coefficient of the first transistor.

7. An electronic circuit, comprising:

a diode-connected first transistor provided with a first control terminal;

a plurality of second transistors that output currents by using a voltage level of the first control terminal as a reference value;

a plurality of third transistors, each being provided with a third control terminal, that control currents output from the plurality of second transistors according to ON/OFF signals input into the third control terminals; and a fourth transistor provided with a fourth control terminal and that outputs a current by using a voltage level of the first control terminal as the reference value, the fourth transistor not being disposed in a current path formed of the third transistors that are set in the ON state by the ON/OFF signals and the second transistors coupled in series with the third transistors that are set in the ON state.

8. An electronic device, having a plurality of unit circuits, each of the plurality of unit circuits comprising:

a diode-connected first transistor provided with a first control terminal;

a plurality of second transistors provided with second control terminals coupled to the first control terminal;

a plurality of third transistors, each being provided with a third control terminal coupled to a signal line, coupled in series with corresponding second transistors; and a fourth transistor provided with a fourth control terminal coupled to the first control terminal, the fourth transistor not being disposed in a current path formed of the third transistors that are set in the ON state by ON signals supplied via the signal lines and the second transistors coupled in series with the third transistors that are set in the ON state, the fourth transistor being coupled to another unit circuit via a connecting line so as to control a voltage level of the first control terminal contained in said unit circuit according to the level of a current output from the fourth transistor.

9. The electronic device according to claim 8, a gain coefficient of the fourth transistor of each of the plurality of unit circuits being the same as a gain coefficient of the first transistor.

10. The electronic device according to claim 8, each of the plurality of unit circuits further comprising:

a fifth transistor provided with a fifth control terminal and coupled in series with the first transistor; and a diode-connected sixth transistor provided with a sixth control terminal coupled to the fifth control terminal.

11. An electronic unit comprising the electronic device set forth in claim 8.

12. An electronic device having a plurality of unit circuits, each of the plurality of unit circuits comprising:

a diode-connected first transistor provided with a first control terminal;

a plurality of second transistors that output currents by using a voltage level of the first control terminal as a reference value;

a plurality of third transistors, each being provided with a third control terminal, that control currents output from the plurality of second transistors according to ON/OFF signals input into the third control terminals; and a fourth transistor provided with a fourth control terminal and that outputs a current by using the voltage level of the first control terminal as the reference value, the current output from the fourth transistor serving as a reference current that sets a voltage level of the first control terminal of another unit circuit.

13. An electronic device having a plurality of unit circuits, each of the plurality of unit circuits comprising:

a diode-connected first transistor provided with a first control terminal;

a plurality of second transistors that output currents by using a voltage level of the first control terminal as a reference value;

a plurality of third transistors, each being provided with a third control terminal, that control currents output from the plurality of second transistors according to ON/OFF signals input into the third control terminals; and a fourth transistor provided with a fourth control terminal and that outputs a current by using the voltage level of the first control terminal as the reference value, the current output from the fourth transistor being supplied to another unit circuit without being supplied to a current path formed of the second transistors coupled in series with the third transistors that are set in the ON state by the ON/OFF signals.

14. The electronic device according to claim 13, the plurality of unit circuits being cascade-connected.

15. An electronic device according to claim 13, each of the plurality of unit circuits further comprising:

a fifth transistor provided with a fifth control terminal and coupled in series with the first transistor; and a diode-connected sixth transistor provided with a sixth control terminal coupled to the fifth control terminal.

16. The electronic device according to claim 13, a gain coefficient of the fourth transistor of each of the plurality of unit circuits being the same as a gain coefficient of the first transistor.

17. An electronic device having a plurality of unit circuits, each of the plurality of unit circuits comprising:

a diode-connected first transistor provided with a first control terminal;

a plurality of second transistors that outputs currents by using a voltage level of the first control terminal as a reference value;

a plurality of third transistors, each being provided with a third control terminal, that outputs currents output from the plurality of second transistors according to ON/OFF signals input into the third control terminals;

a fourth transistor provided with a fourth control terminal and that outputs a current by using the voltage level of the first control terminal as the reference value;

a fifth transistor provided with a fifth control terminal and coupled in series with the first transistor; and a diode-connected sixth transistor provided with a sixth control terminal coupled to the fifth control terminal, the fourth transistor not being coupled to the second transistors coupled in series with the third transistors that are set in the ON state by the ON/OFF signals of the unit circuit containing the fourth transistor, but being coupled to the sixth transistor contained in another unit circuit.

18. The electronic device according to claim 17, the plurality of unit circuits being cascade-connected.

19. The electronic device according to claim 17, a gain coefficient of the fourth transistor of each of the plurality of unit circuits being the same as a gain coefficient of the first transistor.

20. An electro-optical apparatus having a plurality of scanning lines, a plurality of data lines, electro-optical devices disposed at intersections between the plurality of scanning lines and the plurality of data lines, and a data-current supply circuit that supplies a data current to the plurality of data lines, so as to supply a drive current having an amount corresponding to the data current to each of the electro-optical devices, each of the data-current supply circuit comprising:

a diode-connected first transistor provided with a first control terminal;

a plurality of second transistors provided with second control terminals coupled to the first control terminal;

a plurality of third transistors, each being provided with a third control terminal coupled to a signal line through which image data is supplied, coupled in series with the corresponding second transistors; and a fourth transistor provided with a fourth control terminal coupled to the first control terminal, the fourth transistor being coupled to another data-current supply circuit via a connecting line so as to control a voltage level of the first control terminal contained in said data-current supply circuit according to a level of a current output from the fourth transistor.

21. The electro-optical apparatus according to claim 20, the data-current supply circuit further comprising:

a fifth transistor provided with a fifth control terminal and coupled in series with the first transistor; and a diode-connected sixth transistor provided with a sixth control terminal coupled to the fifth control terminal.

22. The electro-optical apparatus according to claim 20, a gain coefficient of the fourth transistor being the same as a gain coefficient of the first transistor.

23. An electronic unit comprising the electro-optical apparatus set forth in claim 20.

24. The electro-optical apparatus according to claim 20, the electro-optical devices being EL devices.

25. The electro-optical apparatus according to claim 24, the EL devices each including a light-emission layer formed of an organic material.

26. An electro-optical apparatus having a plurality of scanning lines, a plurality of data lines, electro-optical devices disposed at intersections between the plurality of scanning lines and the plurality of data lines, and data-current supply circuits that supply data currents to the plurality of data lines, so as to supply a drive current having an amount corresponding to the data current to each of the electro-optical devices, each of the data-current supply circuit comprising:

a diode-connected first transistor provided with a first control terminal;

a plurality of second transistors that output currents by using a voltage level of the first control terminal as a reference value;

a plurality of third transistors, each being provided with a third control terminal, that controls the currents output from the plurality of second transistors according to image data input into the third control terminals; and a fourth transistor provided with a fourth control terminal and that outputs a current by using the voltage level of the first control terminal as the reference value, the current output from the fourth transistor serving as a reference current that sets a voltage level of the first control terminal of another data-current supply circuit.

27. An electro-optical apparatus comprising a plurality of scanning lines, a plurality of data lines, electro-optical devices disposed at intersections between the plurality of scanning lines and the plurality of data lines, and data-current supply circuits that supply data currents to the plurality of data lines, so as to supply a drive current having an amount corresponding to the data current to each of the electro-optical devices, each of the data-current supply circuits comprising:

a diode-connected first transistor provided with a first control terminal;

a plurality of second transistors that output currents by using a voltage level of the first control terminal as a reference value;

a plurality of third transistors, each being provided with a third control terminal, that control the currents output from the plurality of second transistors according to ON/OFF signals input into the third control terminals;

a fourth transistor provided with a fourth control terminal and that output a current by using the voltage level of the first control terminal as the reference value;

a fifth transistor provided with a fifth control terminal and coupled in series with the first transistor; and a diode-connected sixth transistor provided with a sixth control terminal coupled to the fifth control terminal, the fourth transistor not being coupled to the second transistors coupled in series with the third transistors that are set in the ON state by the ON/OFF signals of a unit circuit containing the fourth transistor, but is coupled to the sixth transistor contained in another data-current supply circuit.

28. The electro-optical apparatus according to claim 27, a gain coefficient of the fourth transistor of each of the data-current supply circuits being the same as a gain coefficient of the first transistor.

29. The electro-optical apparatus according to claim 27, the plurality of data-current supply circuits being cascade-connected.

30. The electro-optical apparatus according to claim 27, the data-current supply circuit further comprising:

a fifth transistor provided with a fifth control terminal and coupled in series with the first transistor; and a diode-connected sixth transistor provided with a sixth control terminal coupled to the fifth control terminal.

31. The electro-optical apparatus according to claim 30, a gain coefficient of the sixth transistor being the same as a gain coefficient of the first transistor.

32. An electro-optical apparatus having a plurality of scanning lines, a plurality of data lines, electro-optical devices disposed at intersections between the plurality of scanning lines and the plurality of data lines, and data-current supply circuits that supply data currents to the plurality of data lines, so as to supply a drive current having an amount corresponding to the data current to each of the electro-optical devices, each of the data-current supply circuit comprising:

a diode-connected first transistor provided with a first control terminal;

a plurality of second transistors that output currents by using a voltage level of the first control terminal as a reference value;

a plurality of third transistors, each being provided with a third control terminal, that control currents output from the plurality of second transistors according to image data input into the third control terminals; and a fourth transistor provided with a fourth control terminal and that outputs a current by using the voltage level of the first control terminal as the reference value, the current output from the fourth transistor being supplied to another data-current supply circuit without being supplied to a current path formed of the second transistors coupled in series with the third transistors that are set in the ON state by the image data.

33. The electro-optical apparatus according to claim 32, a gain coefficient of the fourth transistor of each of the plurality of data-current supply circuits being the same as a gain coefficient of the first transistor.

34. The electro-optical apparatus according to claim 32, the plurality of data-current supply circuits being cascade-connected.

35. The electro-optical apparatus according to claim 32, each of the current-supply circuits further comprising:

a fifth transistor provided with a fifth control terminal and coupled in series with the first transistor; and a diode-connected sixth transistor provided with a sixth control terminal coupled to the fifth control terminal.

* * * * *